United States Patent
Wang et al.

(10) Patent No.: US 10,153,191 B2
(45) Date of Patent: Dec. 11, 2018

(54) SUBSTRATE CARRIER SYSTEM AND METHOD FOR USING THE SAME

(71) Applicant: Applied Materials, Inc., Santa Clara, CA (US)

(72) Inventors: Zuoqian Wang, Dublin, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 247 days.

(21) Appl. No.: 15/122,736

(22) PCT Filed: Mar. 20, 2015

(86) PCT No.: PCT/US2015/021673
§ 371 (c)(1),
(2) Date: Aug. 31, 2016

(87) PCT Pub. No.: WO2015/171207
PCT Pub. Date: Nov. 12, 2015

(65) Prior Publication Data
US 2017/0076968 A1     Mar. 16, 2017

Related U.S. Application Data

(60) Provisional application No. 61/991,342, filed on May 9, 2014.

(51) Int. Cl.
*H01L 21/683* (2006.01)
*H01L 51/56* (2006.01)
*H01L 51/00* (2006.01)

(52) U.S. Cl.
CPC ...... *H01L 21/6833* (2013.01); *H01L 51/0011* (2013.01); *H01L 51/56* (2013.01)

(58) Field of Classification Search
CPC ... H01L 21/6833; H01L 51/0011; H01L 51/56
See application file for complete search history.

(56) References Cited

U.S. PATENT DOCUMENTS 6,678,143 B2   1/2004   Masuda et al.
6,768,627 B1   7/2004   Kitabayashi et al.
(Continued)

FOREIGN PATENT DOCUMENTS

EP      0734053 A1      9/1996
JP      H04237148 A     8/1992
(Continued)

OTHER PUBLICATIONS

International Search Report and Written Opinion, PCT/US2014/056378, dated Dec. 19, 2014.
(Continued)

*Primary Examiner* — Zeev V Kitov
(74) *Attorney, Agent, or Firm* — Patterson + Sheridan LLP

(57) ABSTRACT

A substrate carrier system is provided. The substrate carrier system includes a substrate carrier body, an electrode assembly, a support base, and a controller. The substrate carrier body has a substrate supporting surface, and an electrode assembly is disposed in the substrate carrier body. The electrode assembly includes a plurality of laterally spaced apart electrode sets. Each electrode set includes a first electrode interleaved with a second electrode. The support base supports the substrate carrier body. The controller is configured to: select a first group of the electrode sets and a second group of the electrode sets from the plurality of the electrode sets; operate the first group of the electrode sets in a first chucking mode; simultaneously operate the second
(Continued)

group of the electrode sets in a second chucking mode; and selectively switch at least one electrode set from the first group to the second group.

20 Claims, 10 Drawing Sheets

(56) References Cited

U.S. PATENT DOCUMENTS

| | | | |
|---|---|---|---|
| 6,781,812 B2 | 8/2004 | Fuwa et al. | |
| 7,821,767 B2* | 10/2010 | Fujii | H02N 13/00 361/234 |
| 7,881,036 B2 | 2/2011 | Fujisawa et al. | |
| 7,916,447 B2 | 3/2011 | Kobayashi et al. | |
| 8,125,756 B2 | 2/2012 | Poh | |
| 8,238,072 B2 | 8/2012 | Fujisawa et al. | |
| 8,325,457 B2 | 12/2012 | Park et al. | |
| 8,335,070 B2* | 12/2012 | Poh | H02N 13/00 361/234 |
| 8,503,156 B2 | 8/2013 | Ray et al. | |
| 8,730,644 B2 | 5/2014 | Fujisawa et al. | |
| 9,287,806 B2 | 3/2016 | Park | |
| 9,494,875 B2* | 11/2016 | Cornelissen | G03F 7/70708 |
| 2001/0016302 A1 | 8/2001 | Hirayanagi et al. | |
| 2005/0241771 A1 | 11/2005 | Rattner et al. | |
| 2006/0076109 A1 | 4/2006 | Holland et al. | |
| 2007/0141280 A1 | 6/2007 | Rice | |
| 2008/0062609 A1 | 3/2008 | Himori et al. | |
| 2009/0135540 A1* | 5/2009 | Poh | B25B 9/00 361/234 |
| 2010/0025372 A1* | 2/2010 | Tsujimoto | H01J 37/32091 216/71 |
| 2011/0095185 A1* | 4/2011 | Miya | H01J 37/20 250/311 |
| 2011/0227275 A1 | 9/2011 | Poh et al. | |
| 2011/0272278 A1 | 11/2011 | Sugi et al. | |
| 2011/0292561 A1 | 12/2011 | Kamimura et al. | |
| 2012/0227886 A1 | 9/2012 | Hsiao et al. | |
| 2012/0308341 A1 | 12/2012 | Ishizawa et al. | |
| 2013/0228323 A1 | 9/2013 | Makabe et al. | |
| 2015/0331337 A1 | 11/2015 | Sundarrajan et al. | |
| 2016/0064267 A1 | 3/2016 | Toh et al. | |

FOREIGN PATENT DOCUMENTS

| | | |
|---|---|---|
| JP | 2002-357838 A | 12/2000 |
| JP | 2003-179128 A | 6/2003 |
| JP | 2003-243493 A | 8/2003 |
| JP | 2009-088558 A | 4/2009 |

OTHER PUBLICATIONS

International Search Report and Written Opinion, PCT/US2014/056380, dated Dec. 17, 2014.
H. Stieglauer; Mobile Electrostatic Carrier (MEC) Evaluation for a GaAs Wafer Backside Manufacturing Process CS MANTECH Conference, May 17-20, 2010, Portland, Oregon, USA.
Fowlai POH, Non-Contact Transportation System for Thin Glass Plate Utilizing Combination of Air Bearing and Electrostatic Force SICE '99 Jul. 28-30, pp. 1053-1058, Morioka.
International Search Report and Written Opinion, PCT/US2015/021673, dated Jun. 23, 2015.

* cited by examiner

SUBSTRATE CARRIER SYSTEM AND METHOD FOR USING THE SAME

FIELD

The embodiments disclosed generally relate to a substrate carrier and more particularly, a substrate carrier with an integrated electrostatic chuck suitable for use in vertical and other processing systems.

BACKGROUND

Electrostatic chucks are often used to clamp substrates to substrate supports during horizontal substrate processing. Conversely, substrates processed in a vertical orientation are often held on a substrate carrier using a mechanical clamping force. Conventional mechanical clamping carriers used to hold a substrate during transfer and processing may often have poor positional accuracy and may also generate particulate during chucking due to the high mechanical clamping force.

In OLED fabrication, positional accuracy of the mask used over the substrate during deposition of OLED materials is challenging, particularly as the size of the substrate increases. Traditional conventional mechanical clamping carriers which generally hold the edges of the substrate at may contribute to poor positioning of the mask over the substrate since the clamping force is difficult to uniformly apply to the substrate, which may cause the mask to bow or shift position.

Therefore, a need exists for an improved apparatus and method for clamping substrates and masks during vertical and horizontal substrate processing.

SUMMARY

In one embodiment, a substrate carrier system is provided. The substrate carrier system includes a substrate carrier body, an electrode assembly, a support base, and a controller. The substrate carrier body has a substrate supporting surface and an electrode assembly is disposed in the substrate carrier body. The electrode assembly includes a plurality of laterally spaced apart electrode sets. Each electrode set includes a first electrode interleaved with a second electrode. The support base supports the substrate carrier body. The controller is configured to: select a first group of the electrode sets and a second group of the electrode sets from the plurality of the electrode sets; operate the first group of the electrode sets in a first chucking mode; simultaneously operate the second group of the electrode sets in a second chucking mode; and selectively switch at least one electrode set from the first group to the second group.

In another embodiment, a substrate carrier system configured for transporting through a processing system is provided. The substrate carrier system includes a substrate carrier body, an electrode assembly, a support base, a power supply, and a controller. The substrate carrier body has a substrate supporting surface and an electrode assembly is disposed in the substrate carrier body. The electrode assembly includes a plurality of electrode sets, laterally spaced apart in columns. Each electrode set includes a first electrode interleaved with a second electrode. The support base supports the substrate carrier body. The power supply is located on or in the support base and is configured to supply a first clamping voltage and a second clamping voltage. The controller is located on or in the support base and is configured to: select a first group of the electrode sets and a second group of the electrode sets from the plurality of the electrode sets; operate the first group of the electrode sets in a first chucking mode; simultaneously operate the second group of the electrode sets in a second chucking mode; and sequentially switch electrode sets from the first group to the second group from a first end to a second end of the substrate carrier body.

In another embodiment, a method of clamping a substrate and a mask to a substrate supporting surface of a substrate carrier body is provided. An electrode assembly is disposed in the substrate carrier body. The electrode assembly includes a plurality of laterally spaced apart electrode sets and each electrode set includes a first electrode interleaved with a second electrode. The method includes selecting a first group of the electrode sets and a second group of the electrode sets; operating the first group of the electrode sets in a first chucking mode; simultaneously operating the second group of the electrode sets in a second chucking mode; and selectively switching at least one electrode set from the first group to the second group.

BRIEF DESCRIPTION OF THE DRAWINGS

So that the manner in which the above recited features of the embodiments disclosed above can be understood in detail, a more particular description, briefly summarized above, may be had by reference to the following embodiments, some of which are illustrated in the appended drawings. It is to be noted, however, that the appended drawings illustrate only typical embodiments and are therefore not to be considered limiting of its scope to exclude other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments disclosed generally relate to a substrate carrier system suitable for clamping a substrate and a mask. The substrate carrier system can electrostatically clamp the substrate to the substrate carrier system and either electrostatically clamp or electromagnetically clamp portions of the mask over the substrate to the substrate carrier system. The portions of the mask that are clamped can correspond to portions of the substrate being processed at a point in time or can compensate for thermal expansion. Although the substrate carrier system disclosed herein is particularly suitable for use in OLED fabrication, the substrate carrier system may also be beneficially utilized in flat panel display, solar cell, architectural glass or other flat substrate process wherein improved control of chucking the substrate to a substrate carrier system is desirable.

Figure 1A:
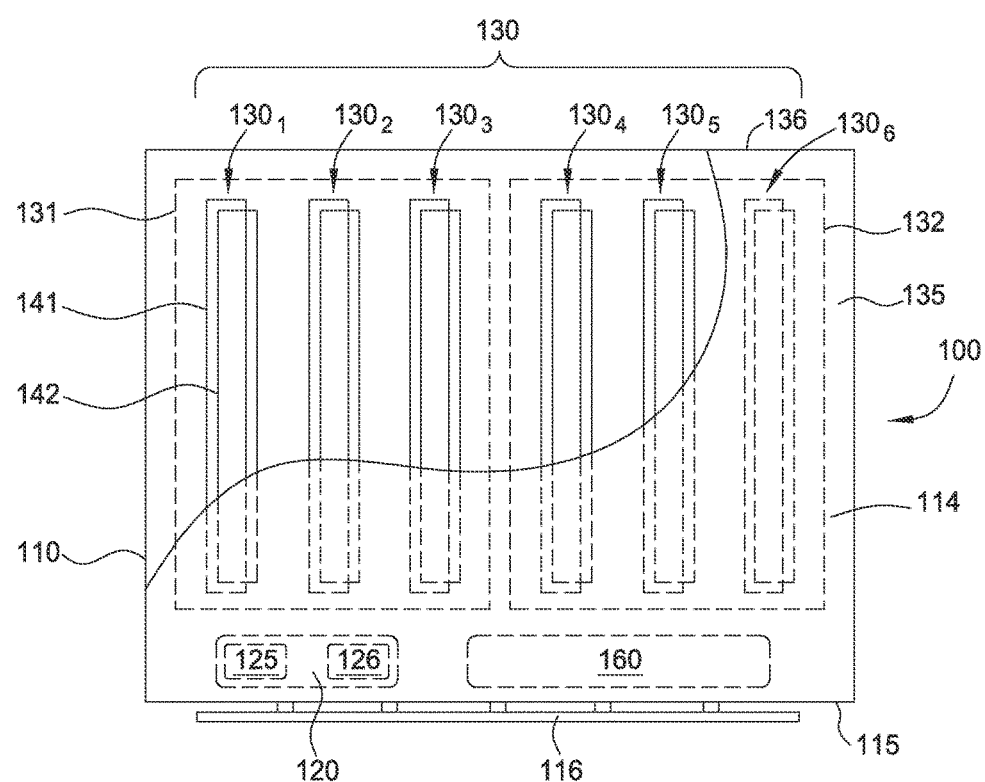
FIG. 1A is a front sectional view of a substrate carrier system, according to one embodiment.

FIG. 1A is a front sectional view of a substrate carrier system 100 according to one embodiment. The substrate carrier system 100 can be used to carry a substrate 10, and optionally a mask 20, through a processing system 50, as further described below with reference to FIG. 1C. The substrate carrier system 100 includes a substrate carrier body 110, an electrode assembly 135, a support base 112, and optionally one or more of a power supply 120, and a controller 160. The substrate carrier body 110 includes a substrate supporting surface 114. In some embodiments, the electrode assembly 135 can be disposed in or on the substrate carrier body 110. The support base 112 can be disposed below or behind the substrate carrier body 110 to support the substrate carrier body 110 and the electrode assembly 135. The support base 112 may include a fluid reservoir or channels for heating and cooling. The support base 112 can have a high thermal mass to prevent rapid temperature fluctuations of the substrate 10 secured to the substrate carrier system 100. The support base 112 may be made of a metallic material, such as aluminum, and can be between about 1 cm and about 10 cm thick, for example about 2.5 cm thick.

The substrate carrier body 110, and thus the substrate supporting surface 114, may be fabricated from a ceramic material. In some embodiments, the substrate carrier body 110 and/or the substrate supporting surface 114 may be fabricated from a polymer. For example, the substrate carrier body 110 may be fabricated from a polymer or polymer sheets, such as polyimide, polyether ether ketone, polyaryletherketone, and the like. The substrate carrier body 110 and the substrate supporting surface 114 may have a generally polygonal shape, such as a square or rectangular shape. However, it is contemplated that the substrate supporting surface 114 of the substrate carrier body 110 may alternatively have another shape, such as circular.

The substrate supporting surface 114 extends from a top 136 of the substrate carrier body 110 and completely covers the electrode assembly 135. The substrate supporting surface 114 provides a surface on which the substrate 10 is secured during transport and processing on the substrate carrier system 100. In FIG. 1A, a portion of the substrate supporting surface 114 is cutaway to illustrate portions of the underlying electrode assembly 135.

Continuing to refer to FIG. 1A, the electrode assembly 135 includes a plurality of laterally spaced apart electrode sets 130. Each electrode set 130 includes a first electrode 141 interleaved with a second electrode 142. The electrode assembly 135 may be embedded in the substrate carrier body 110. For example, the electrode assembly 135 may be embedded in ceramic material comprising the substrate carrier body 110 or disposed between polymer sheets comprising the substrate carrier body 110. In yet embodiments, the electrode assembly 135 may be disposed on a printed circuit board (PCB) disposed on the substrate carrier body 110. Conductors coupling the electrode assembly 135 to the controller 160 may be formed on or in the substrate carrier body 110 or PCB, or within grooves of the substrate carrier body 110 or PCB. The electrode assembly 135 can be designed to have a substantially similar shape to the substrate supporting surface 114. In some embodiments, the electrode assembly 135 as viewed through the substrate supporting surface 114 of the substrate carrier body 110 may be rectangular and have height and width dimensions ranging between about 0.1 m to about 10 m.

In the embodiment illustrated in FIG. 1A the electrode sets 130 of the electrode assembly 135 have a vertical orientation and are laterally spaced apart in columns, although other orientations may be utilized. For example, the electrode sets 130 can be arranged in a grid pattern, a polar array, circular pattern or other pattern. Although only a few individual electrode sets 130, such as electrode sets $130_{1-6}$, are shown in FIG. 1A, in some embodiments there can be many more individual electrode sets 130 comprising the electrode assembly 135, so that the individually controllable electrodes 141, 142 can be used to precisely control the clamping forces exerted through different areas of the substrate supporting surface 114.

As discussed above, each individual electrode set 130 includes at least two interleaving electrodes, shown in FIG. 1A as electrodes 141, 142. The electrodes 141, 142 are independently controlled by the controller 160 so that different electrical properties (e.g., current, voltage, etc.) can be applied to the electrodes 141, 142 within a single electrode set 130. Additionally, each electrode 141, 142 comprising one electrode set 130 may be controlled differently than electrodes 141, 142 comprising a different electrode set 130.

The power supply 120 and the controller 160, as well as associated electrical and electronic devices and wiring may be disposed in or otherwise connected to the substrate carrier body 110. In some embodiments, one or both of the controller 160 and power supply 120 may be located on or in the support base 112. In other embodiments, the power supply 120 and the controller 160 may be located remotely with respect to the substrate carrier body 110. The power supply 120 is configured to supply power to the electrode sets 130. The power supply 120 can include a battery 125 and an optional charger 126.

The controller 160 may be configured to select a first group 131 of the electrode sets 130 and a second group 132 of the electrode sets 130, so that different voltages or currents can be provided to the first group 131 relative to the second group 132 of the electrode sets 130. As will be described in further detail below, the first group 131 of electrode sets 130 can be used to electrostatically clamp the substrate 10 to the substrate carrier system 100, and the second group 132 of electrodes sets 130 can be used to electrostatically or electromagnetically clamp the mask 20 over the substrate 10 to the substrate carrier system 100. Which electrode sets 130 are included in the first group 131 and the second group 132 can change during processing, so that the mask 20 can be clamped to different areas of the substrate 10.

The substrate carrier system 100 can also include a guide rail 116 to aid in transporting the substrate carrier body 110 and the substrate 10. The guide rail 116 may have an orientation substantially parallel with a plane of the substrate supporting surface 114. The guide rail 116 may be coupled to or extend from a bottom 115 the substrate carrier body 110 or the support base 112. The guide rail 116 can be configured to interface with a transfer mechanism of a drive system, as discussed further below with reference to FIG. 1C.

Figure 1B:
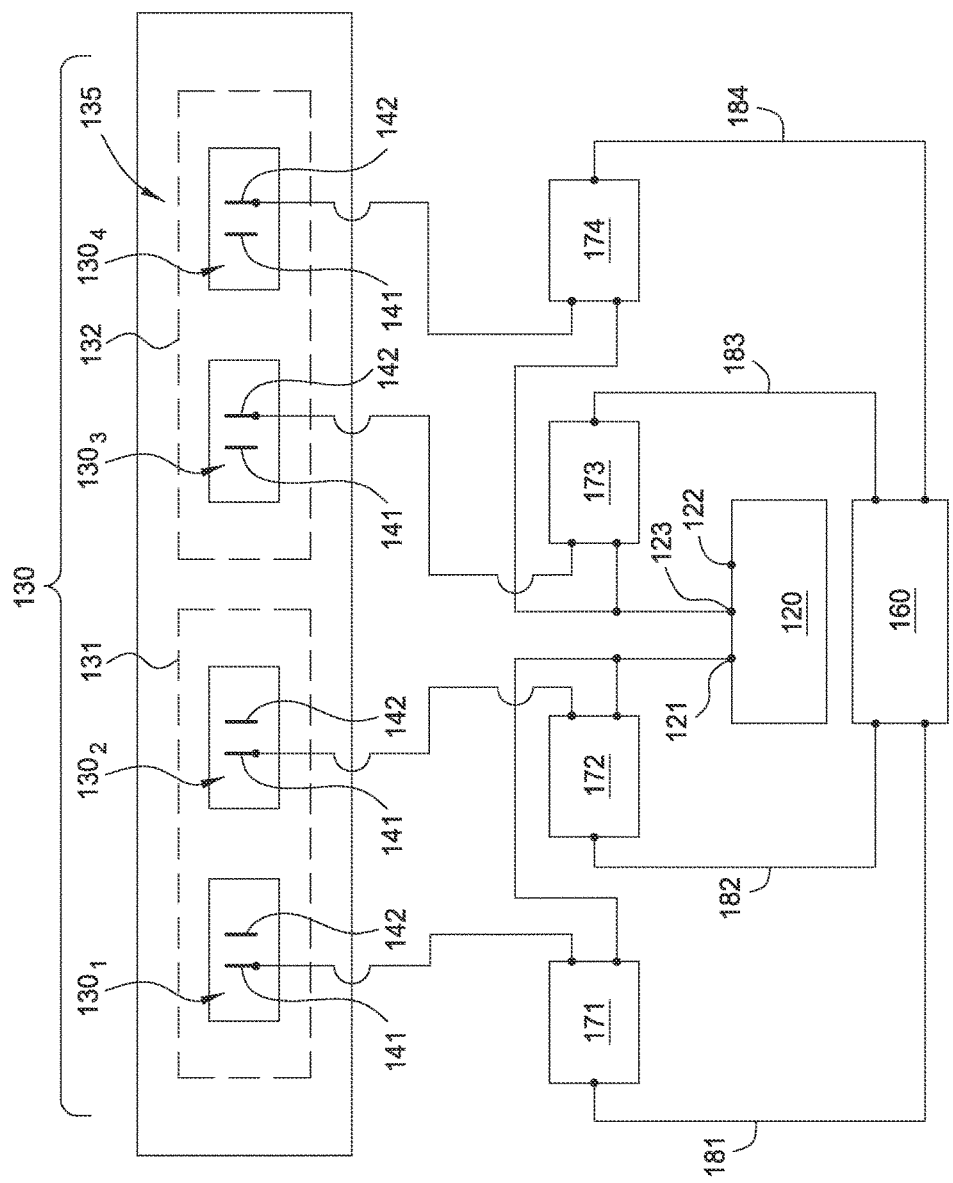
FIG. 1B is a block diagram showing exemplary electrical connections to an electrode assembly in accordance with one embodiment.

FIG. 1B is a block diagram showing exemplary electrical connections to the electrode assembly 135 in accordance with one embodiment. The power supply 120 can be configured to supply at least a first clamping voltage, and optionally in some embodiments, one or more of a second clamping voltage and a clamping current to the electrode sets 130. The first clamping voltage can be supplied from a first clamping voltage terminal 121. In one embodiment, the second clamping voltage can be provided from a second clamping voltage terminal 122, while in another embodiment, the clamping current can be supplied from a clamping current terminal 123. The clamping current can be provided at the first clamping voltage, the second clamping voltage, or another suitable voltage.

Each electrode set 130 can be coupled to a respective switching device 171-174, such as a solid state switch, contactor or relay. Each switching device 171-174 can be coupled to a respective control circuit 181-184 to enable the controller 160 to provide one or more control signals to the switching devices 171-174. The control circuits 181-184 are shown as individual hard-wired connections, but other means for providing a control signal could be used, such as a fieldbus, or a wireless transmitter/receiver, among others. Each switching device 171-174 can have multiple connections (not shown) to the power supply 120 and the controller 160, so that a switching device, such as switching device 171, can couple an electrode set $130_1$ to the first clamping voltage, the second clamping voltage, or the clamping current based on the control signal sent to the switching device 171.

Figure 1C:
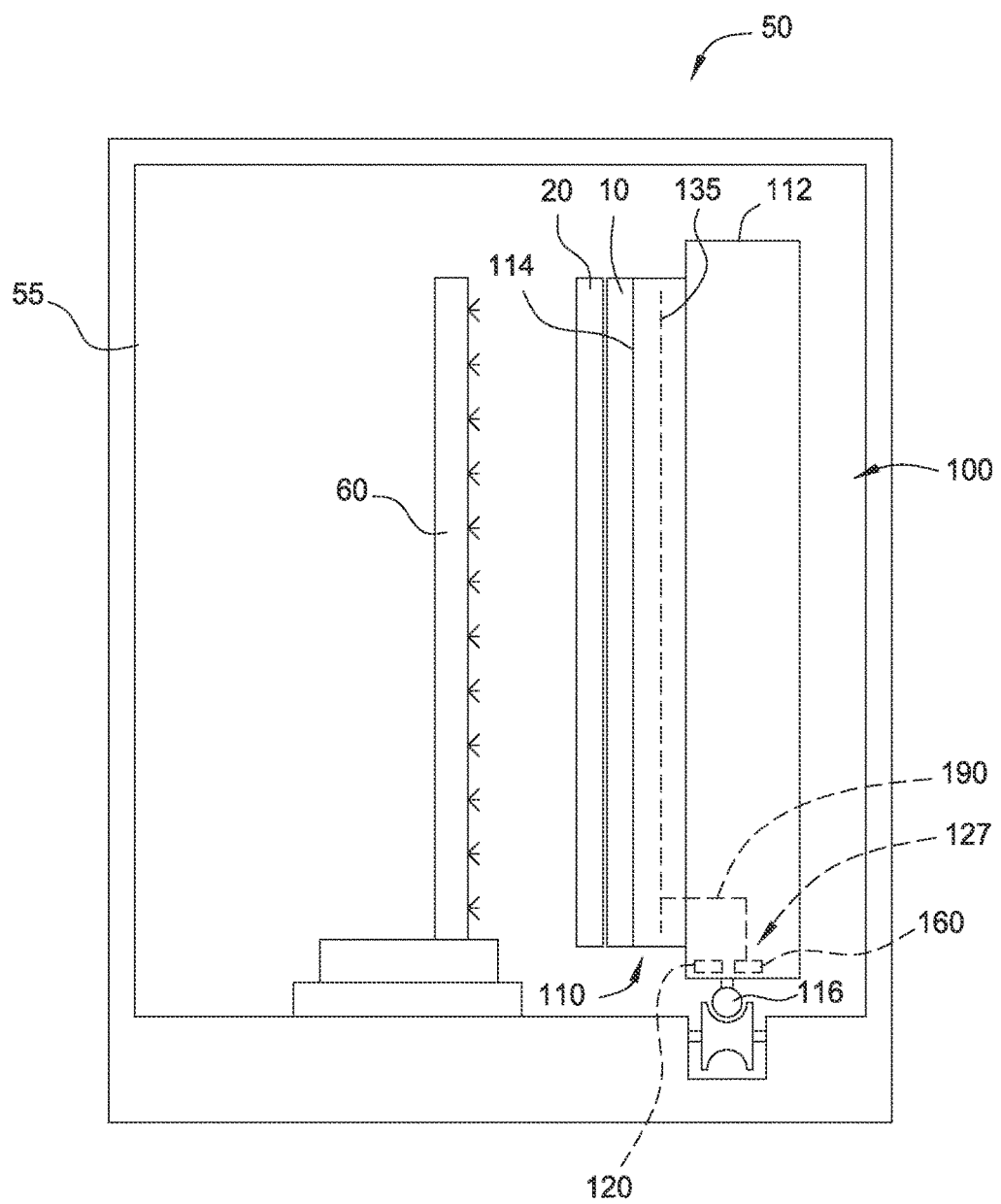
FIG. 1C is a side schematic sectional view of a substrate carrier system in a processing system, according to one embodiment.

The controller 160 can be configured to select which individual electrode sets 130 are included in a first group 131 of the electrode sets 130 and a second group 132 of the electrode sets 130. In example depicted in FIG. 1B, the first group 131 of the electrode sets 130 is selected by the controller 160 to include the electrode set $130_1$ and electrode set $130_2$, while the second group 132 is selected to include the electrode set $130_3$ and electrode set $130_4$. The controller 160 can be further configured to provide the first clamping voltage to at least the first group 131 of the electrode sets 130 to operate the first group 131 of the electrode sets 130 in a first chucking mode. For example in the first chucking mode, the controller 160 may operate to select the electrode set $130_1$ and electrode set $130_2$ to define the first group 131. Once the first group 131 is defined, the controller 160 may operate to provide control signals through control circuits 181, 182 to switching devices 171, 172, such that the first clamping voltage from terminal 121 is provided to electrode set $130_1$ and electrode set $130_2$. The first clamping voltage can be used to electrostatically clamp the substrate 10 to the substrate supporting surface 114 as illustrated in FIG. 1C.

The first clamping voltage may be ramped up so that the electrostatic force used to electrostatically clamp the substrate 10 to the substrate supporting surface 114 gradually increases to substantially prevent the substrate 10 from contacting the substrate supporting surface 114 in a manner that generates undesirable particles. Additionally, as each electrode set 130 in the first group 131 may be controlled independently form the other electrode sets 130 in the first group 131, the electrode sets 130 in the first group 131 may be energized or ramped up in a center to edge or edge to opposite edge sequence which chucks the substrate 10 to the supporting surface 114 a manner that substantially prevents air pockets from being trapped between the substrate 10 and the supporting surface 114, which ultimately improves the flatness of the chucked substrate 10.

The controller 160 can also be configured to provide the second clamping voltage or the clamping current to at least the second group 132 of the electrode sets 130 to operate the second group 132 of the electrode sets 130 in a second chucking mode. For example the second chucking mode, the controller 160 may operate to provide control signals through control circuits 183, 184 to switching devices 173, 174 to supply the clamping current from terminal 123 to electrode set $130_3$ and electrode set $130_4$. The controller 160 may operate the electrode assembly 135 simultaneously in both the first chucking and second chucking modes. The second mode may be used to electromagnetically clamp the mask 20 over the substrate 10 to the substrate supporting surface 114, as illustrated in FIG. 1C. Alternatively, the second chucking mode can be used to supply the second clamping voltage to electrostatically clamp the mask 20 over the substrate 10 to the substrate supporting surface 114, as illustrated in FIG. 1C.

The second clamping voltage or current may be ramped up so that the electrostatic or electromagnetic force used to clamp the mask 20 to the substrate 10 and the substrate supporting surface 114 gradually increases to smoothly clamp the mask 20 to the substrate 10. Smoothly chucking the mask 20 enhances the positional accuracy of the mask 20 while substantially preventing generation of undesirable particles. Additionally, as each electrode set 130 in the first group 131 may be controlled independently form the other electrode sets 130 in the first group 131, the electrode sets 130 in the first group 131 may be energized or ramped up in a center to edge or edge to opposite edge sequence which chucks the mask to the supporting surface 114 a manner that substantially prevents the mask 20 from bowing, which ultimately improves the flatness of mask 20 on top of the chucked substrate 10.

As referenced above, FIG. 1C is a schematic side sectional view of the substrate carrier system 100 disposed in a processing system 50. The substrate carrier system 100 carries the substrate 10 through the different chambers/modules of the processing system 50. Electronics 127 represent the controller 160 and power supply 120 that were visible in FIG. 1A. Electrical connections 190 represent the wiring and switching devices between the controller 160 and the electrode assembly 135 shown in FIG. 1B. The processing system 50 may be configured for deposition, etch, implantation, annealing or other processes. The processing system 50 can include a processing chamber 55. The processing chamber 55 may house a spray bar 60 for depositing materials on the substrate 10. In one embodiment, the materials may be deposited on the substrate 10 using a thermal evaporation technique performed in a vacuum within the processing chamber 55. For example, the spray bar 60 may be configured to deposit materials suitable for OLED device fabrication, such as organic materials. Some organic materials suitable for OLED fabrication include organometallic chelates (for example Tris(8-hydroxyquinolinato)aluminum (Alq3)), fluorescent and phosphorescent dyes and conjugated dendrimers. The substrate carrier system 100 can be used to carry and clamp the substrate 10 and a mask 20 to the substrate carrier system 100 during processing in the processing system 50. The guide rail 116 can be used to interface with a transport mechanism 117 to aid in positioning the substrate carrier system 100 within the processing chamber 55, and for moving the substrate carrier system 100 into and out of the processing chamber 55. Once the substrate carrier system 100 is disposed in a processing position within the processing chamber 55, the spray bar 60 may translate across the substrate 10 retained to the substrate carrier system 100 by the electrode assembly 135. Referring to FIGS. 1B and 1C, controller 160 may adjust the control signals in order to supply the first clamping voltage or one or more of the clamping current and the second clamping voltage to the different electrode sets 130 based on the lateral position of the spray bar 60 as the spray bar 60 traverses across the substrate 10.

Figure 2A:
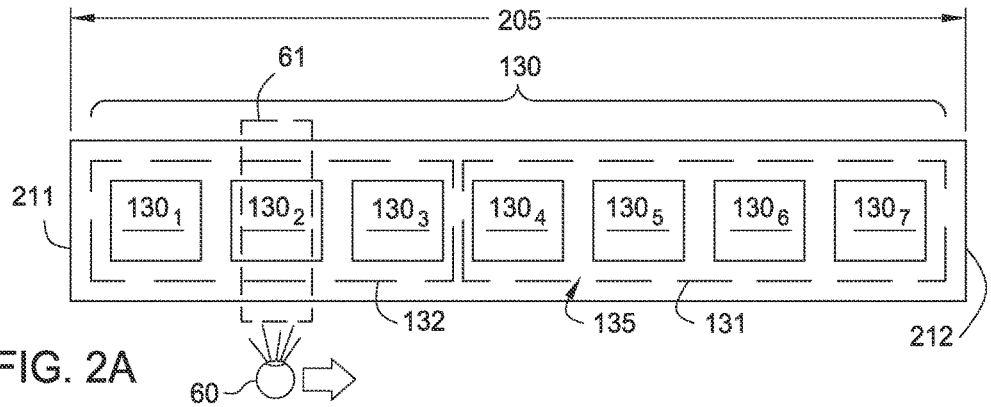
FIGS. 2A-2D illustrate a sequence of a spray bar translating past an electrode assembly in accordance with one embodiment.

FIGS. 2A-2D illustrate a sequence for operating the electrode assembly 135 of the substrate carrier system 100 as the spray bar 60 translates across the electrode assembly 135 in accordance with one embodiment. In each of FIGS. 2A-2D, a top view of the electrode assembly 135 is schematically shown with the spray bar 60 in a different lateral position relative to the individual electrode sets 130 of the electrode assembly 135. As discussed above, the electrode assembly 135 may have a rectangular shape, having a width dimension 210 defined between a first end 211 and a second end 212 of the substrate carrier body 110. The electrode sets 130 may be laterally spaced apart between the first and second ends 211, 212 of the substrate carrier body 110 in the direction of the width dimension 210. Although FIGS. 2A-2D show seven individual electrode sets $130_1$-$130_7$, there can be more or less of individual electrode sets 130. The controller 160, not shown in FIGS. 2A-D, elects which electrode sets 130, shown as electrode sets $130_1$-$130_7$, are arranged into the first group 131 and the second group 132. The first group 131 typically includes a series of adjacent electrode sets, such as electrode sets $130_1$-$130_3$ as illustrated in FIG. 2A.

The controller 160 is configured to sequentially switch one or more electrode sets 130 from the second group 132 to the first group 131 in response to the relative position of the spray bar 60 to each individual electrode set 130. The controller 160 is also configured to switch electrode sets 130 from the first group 131 to the second group 132 in response to the relative position of the spray bar 60 to each individual electrode set 130. The sequence can be synchronized according to a position of the spray bar 60, shown as positions 61-64 in FIGS. 2A-2D, or any other external component relative to a reference, such as the first end 211 of the substrate carrier body 110. In one embodiment, the controller 160 is configured to sequentially switch electrode sets 130 from the first group 131 to the second group 132 from the first end 211 to the second end 212 of the electrode assembly 135 and the substrate carrier body 110.

In some embodiments, communication from proximity sensors or limit switches located in the processing chamber 55, or other signal external from the substrate carrier system 100, can be used to provide the controller 160 with a metric indicative of the position of the spray bar 60 relative to the individual electrode sets 130 of the electrode assembly 135 or the substrate carrier body 110. In response to the communication or signal, the controller 160 selects which electrode sets 130 are designated as belonging to the first group 131 and which electrode sets 130 are designated as belonging to the second group 132. In other embodiments, an analog sensor (not shown), such as a capacitive position detecting sensor, can be used to enable the controller 160 to continuously monitor the position of spray bar 60 relative to a reference in the processing system, such as the first end 211 of the substrate carrier body 110. In other embodiments, the spray bar 60 can translate across the substrate 10 according to a timed sequence executed by the controller 160 enabling the controller 160 to determine the position of the spray bar 60 based on the step or point in time of the timed sequence.

Referring first to FIG. 2A, the spray bar 60 is shown in a first position 61 in relation to the electrode assembly 135. The controller 160 is configured to select which of the electrode sets 130 are to comprise the first group 131 and operate in the first chucking mode and which of the electrode sets 130 are to comprise a second group 132 and operate in the second chucking mode. How the first and second chucking modes operate are discussed in further detail with reference to FIGS. 3A-5B below. The selection made by the controller 160 may be based on which electrode sets 130 are in closest proximity to the spray bar 60. For example, the controller 160 can select the electrode sets 130 in the second group 132 by including one or more electrode sets 130 directly in front of the spray bar 60 and including one or more electrode sets 130 to either side of the spray bar 60. Consequently, the second group 132 of FIG. 2A includes electrode set $130_2$ that is directly in front of the spray bar 60 and electrode sets $130_1$, $130_3$ that are immediately to either side of the spray bar 60.

The controller 160 can select the first group 131 by including all of the electrode sets 130 not included in the second group 132, such as electrode sets $130_4$-$130_7$ as shown in FIG. 2A. The controller 160 can be configured to couple the first clamping voltage to the electrode sets 130 in the first group 131 and couples the second clamping voltage or the clamping current to the electrode sets 130 in the second group 132. Electrode sets $130_4$-$130_7$ in the first group 131, operating in the first chucking mode, electrostatically clamp the substrate 10 to the substrate carrier system 100. Electrode sets $130_1$-$130_3$ in the second group 132, operating in the second chucking mode, either electrostatically or electromagnetically clamp the mask 20 over the substrate 10 to the substrate carrier system 100. Thus, the substrate carrier system 100 only clamps the mask 20 over an area of the substrate 10 that is directly in front of, or immediately proximate to, the spray bar 60. By only clamping the mask 20 over the area of the substrate 10 proximate the spray bar 60 which is actively having material deposited thereon, to positional accuracy of the mask 20 is maintained while enhancing the flatness of the mask 20 over the substrate 10. Moreover, by reducing the contact area of the mask 20 to the substrate 10 to only the region defined by the second group 132 of electrode sets 130, the potential for particle generation is reduced, which increases device yield and performance.

Figure 2B:
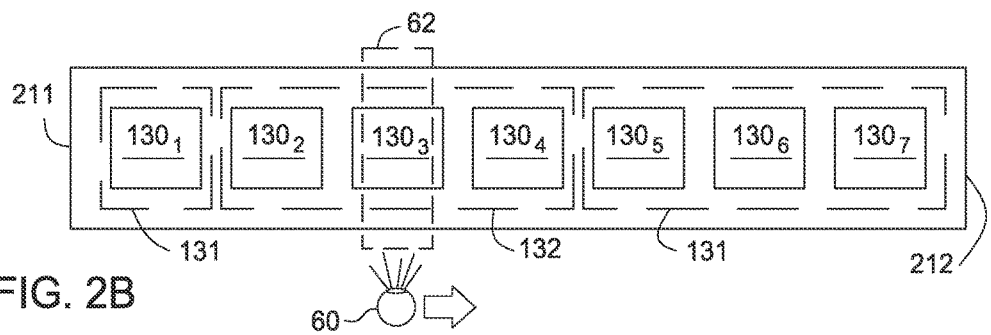

As the deposition sequence continues within the processing chamber 55, the spray bar 60 moves in a direction towards the second end 212 from the first position 61 to a second position 62 relative to the electrode assembly 135, as depicted in FIG. 2B. As the spray bar 60 translates from the first position 61 to the second position 62, the controller 160 re-determines which electrode sets 130 belong in the first and second groups 131, 132. For example, the controller 160 in response to a determination that the spray bar 60 is currently in the second position 62, switches (i.e., reassigns) one or more electrode sets 130, such as electrode set $130_1$, from the second group 132 to the first group 131. The controller 160 also switches (i.e., reassigns) one or more electrode sets 130, such as electrode set $130_4$, from the first group 131 to the second group 132.

Figure 2C:
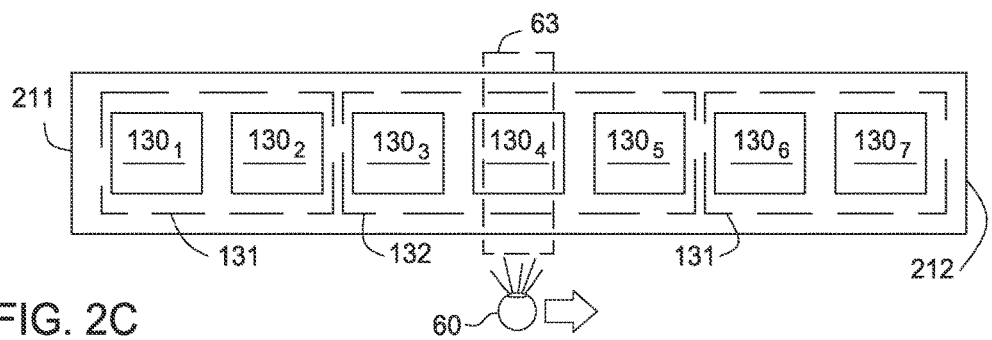

Referring next to FIG. 2C, the spray bar 60 is shown later in the processing sequence in a third position 63 in relation to the electrode assembly 135. In FIG. 2C, the spray bar 60 has translated further towards second end 212 from the second position 62 shown in FIG. 2B to the third position 63 shown in FIG. 2C. As the spray bar 60 translates from the second position 62 to the third position 63, the controller 160 re-determines which electrode sets 130 belong in the first and second groups 131, 132. For example, the controller 160 in response to a determination that the spray bar 60 is currently in the third position 63, switches (i.e., reassigns) one or more electrode sets 130, such as electrode set $130_2$, from the second group 132 to the first group 131. The controller 160 also switches (i.e., reassigns) one or more electrode sets 130, such as electrode set $130_5$, from the first group 131 to the second group 132.

Figure 2D:
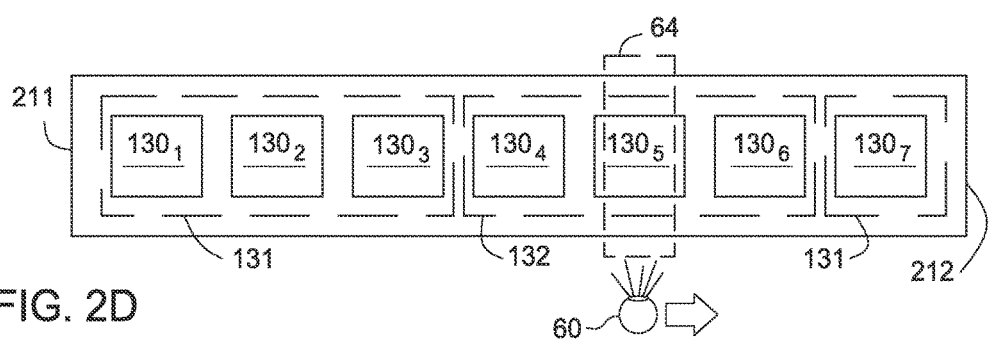

Referring next to FIG. 2D, the spray bar 60 is shown later in the processing sequence in a fourth position 64 in relation to the electrode assembly 135. In FIG. 2D, the spray bar 60 has translated further towards second end 212 from the third position 63 shown in FIG. 2C to the fourth position 64 shown in FIG. 2D. As the spray bar 60 translates from the third position 63 to the fourth position 64, the controller 160 re-determines which electrode sets 130 belong in the first and second groups 131, 132. For example, the controller 160 in response to a determination that the spray bar 60 is currently in the fourth position 64, switches (i.e., reassigns) one or more electrode sets 130, such as electrode set $130_3$, from the second group 132 to the first group 131. The controller 160 also switches (i.e., reassigns) one or more electrode sets 130, such as electrode set $130_6$, from the first group 131 to the second group 132.

As illustrated in the sequence depicted in FIGS. 2A-2D, the electrode sets 130 assigned to the first group 131 to second group 132 changes in response to the position of the spray bar 60 or other information provided to the controller 160. Thus, in embodiments wherein deposition occurs incrementally across the substrate, such as advancing from one end of the substrate 10 to the other, the electrode sets 130 assigned to the first group 131 to second group 132 may sequentially switch in a wave-like pattern, e.g., consecutively across the substrate carrier system 100, so that the portion of the electrode assembly 135 operating in the second mode also traverses across the substrate carrier system 100 sequentially from adding one or more electrode set 130 to the second group 132 on the front-side of the group 132 in the direction of advance, while removing one or more electrode set 130 to the second group 132 from the back-side of the group 132.

Although FIGS. 2A-2D show the electrode sets 130 laterally spaced apart along the width dimension 210 of the electrode assembly 135, other arrangements can be used, such as a rectangular or square grid, or a circular arrangement. The arrangement of the electrode sets in an electrode assembly can be designed to match the geometries of areas on a substrate to be processed. For example, the rectangular spray bar 60 treating a rectangular area of the substrate 10 works well with the electrode sets 130 arranged in a rectangular pattern on the electrode assembly 135. If a spray bar can translate in more than one dimension, then a grid arrangement of electrode sets may be beneficial. If a spray bar can translate in a circular pattern, then a circular arrangement or grid arrangement of electrode sets may be beneficial.

Figure 3A:
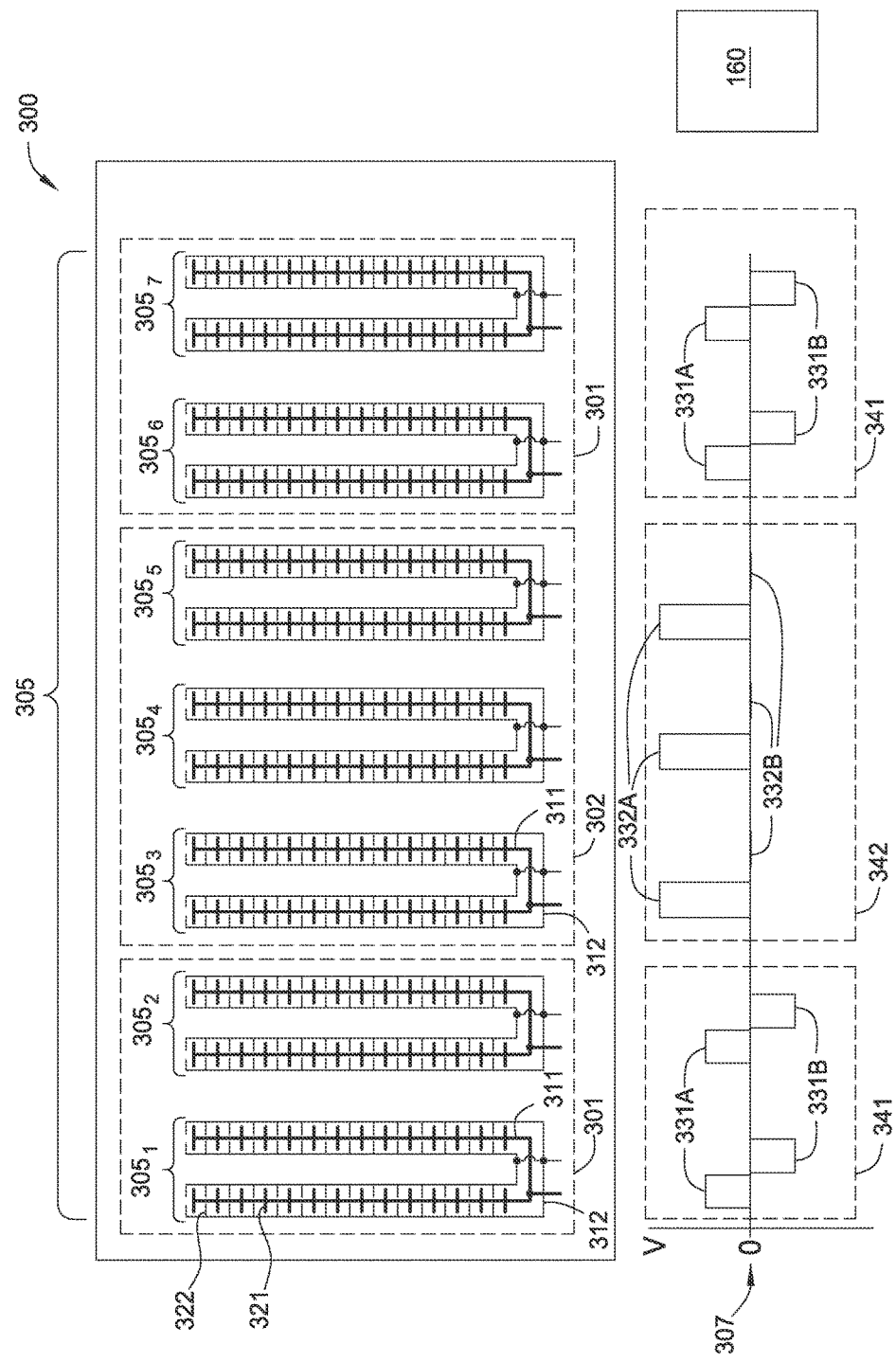
FIGS. 3A and 3B illustrate two operational states of an electrode assembly in accordance with one embodiment.
Figure 3B:
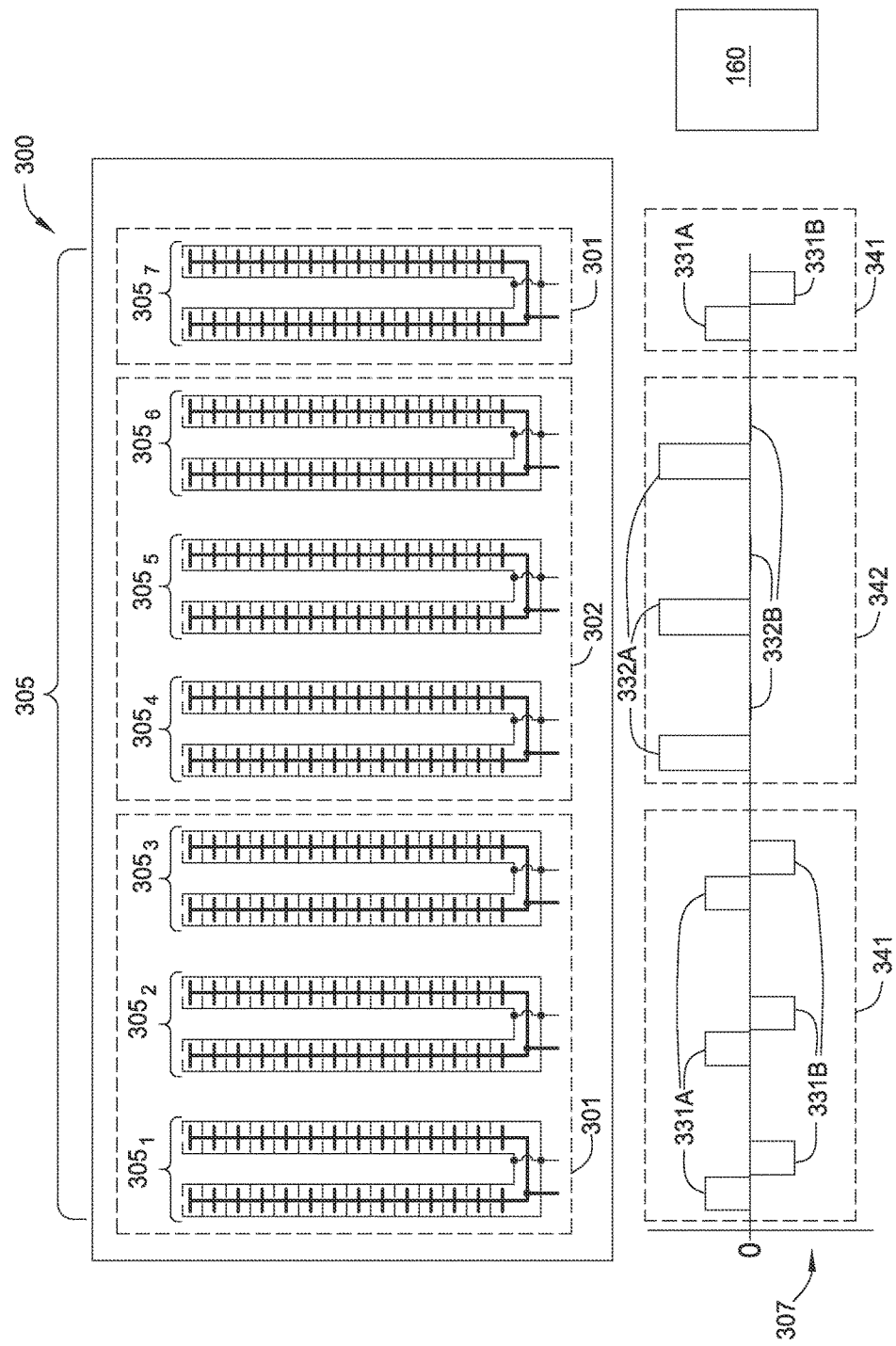

FIGS. 3A and 3B illustrate two (e.g., the first and second) operational states of an electrode assembly 300 in accordance with one embodiment. The electrode assembly 300 is advantageous particularly when used with a mask 20 that is held at ground, for example, the reference ground of the processing system 50 or earth ground. The electrode assembly 300 may be used as the electrode assembly 135 in the substrate carrier system 100, or other substrate carrier system. The electrode assembly 300 is coupled to the controller 160, which controls operation of the electrode assembly 300, for example as described above with reference to FIGS. 2A-2D. The electrode assembly 300 includes a plurality of laterally spaced apart electrode sets 305, and each individual electrode set $305_1$-$305_7$ includes a first electrode 311 interleaved with a second electrode 312. In one embodiment, each first electrode 311 includes a first set of fingers 321, and each second electrode 312 includes a second set of fingers 322. The first set of fingers 321 are interleaved with the second set of fingers 322. It is believed that interleaving the fingers 321, 322 provides a longer interface between the electrodes generating the electrostatic force, thus utilizing less power to generate greater electrostatic force, which takes longer to dissipate once power is removed, allowing the substrate 10 to remain chucked to the substrate carrier system 100 for short periods after power is removed.

A graph 307 illustrated below the electrode assembly 300 shows voltages applied to the first electrode 311 and the second electrode 312 of different electrode sets 305 selected according to the location of the electrode set 305 of the electrode assembly 300 relative to the spray bar 60 (as shown in FIGS. 2A-D). For example, the graph 307 shows a positive first clamping voltage 331A applied to the first electrode 311 of electrode sets $305_1$-$305_2$, $305_6$-$305_7$ and a negative first clamping voltage 331B applied to the second electrode 312 of electrode sets $305_1$-$305_2$, $305_6$-$305_7$. Alternatively, the positive first clamping voltage 331A can be provided to the second electrode 312 of electrode sets $305_1$-$305_2$, $305_6$-$305_7$ and the negative first clamping voltage 331B can be applied to the first electrode 311 of electrode sets $305_1$-$305_2$, $305_6$-$305_7$. The terms positive and negative refer to the amplitude of the first clamping voltage 331A and first clamping voltage 331B relative to the ground voltage of the mask 20. In the example depicted in FIGS. 3A-B, the ground voltage of the mask 20 is approximately zero Volts, the first clamping voltage 331A and first clamping voltage 331B have voltage of substantially equal amplitude by opposite polarity relative to the ground voltage of the mask 20. The polarity of the first clamping voltages 331A, 331B provided to each electrode 311, 312 can be reversible during operation.

The graph 307 also shows a second clamping voltage 332A being applied to the first electrode 311 of electrode sets $305_3$-$305_5$ and the voltage 332B being applied to the second electrode 312 of electrode sets $305_3$-$305_5$ being approximately equal to the ground voltage of the mask 20, e.g., about zero Volts. Alternatively, the second clamping voltage 332A can be provided to the second electrode 312 of electrode sets $305_3$-$305_5$, and the second clamping voltage 332B applied to the first electrode 311 of electrode sets $305_3$-$305_5$ be approximately equal to the ground voltage of the mask 20. The polarity of the second clamping voltage 332A provided to either electrode 311, 312 can be reversible during operation. The potential difference between the second clamping voltages 332A, 332B may be approximately equal to the potential difference between the first clamping voltages 331A, 331B, but since the second clamping voltage 332B is approximately equal to the ground voltage of the mask 20, the electrode assembly 300 functions as a monopolar electrostatic chuck when the electrode assembly 300 is operated in the second mode.

As discussed above, the controller 160 may be configured to select a first group 301 of the electrode sets 305 and a second group 302 of the electrode sets 305. The electrode sets 305 included in the first group 301 can be used to electrostatically clamp the substrate 10 and the electrode sets 305 included in the second group 302 can be used to electrostatically clamp the mask 20 over the substrate 10 to the substrate supporting surface 114 as illustrated in FIG. 1C. The controller 160 can be configured to operate the first group 301 of the electrode sets 305 in a first chucking mode by providing the first clamping voltages 331A, 331B to at least the first group 301 of the electrode sets 305. The first clamping voltages 331A, 331B can be DC voltages between about 500V and about 10,000V, for example about 3,000V. The electrodes 311, 312 function as a bipolar electrostatic chuck to the substrate 10 when the electrodes 311, 312 are operated in the first chucking mode. Since the chucking force generally does not extend through the substrate 10 when operated bipolar electrostatic chuck, the substrate 10 but not the mask 20 is chucked by regions of the electrode assembly 300 operating in the first chucking mode.

The controller 160 can also be configured to operate the second group 302 of the electrode sets 305 in a second chucking mode by providing the second clamping voltage 332A to the second group 302 of the electrode sets 305. The electrodes 311, 312 when operated in the second chucking mode functions as a monopolar electrostatic chuck because the second clamping voltage 332B is approximately equal to the ground voltage of the mask 20. The second clamping voltage 332A can be a DC voltage between about 600V and about 20,000V, for example about 6,000V. The second clamping voltage 332A can be a positive or negative voltage. The amplitude of the second clamping voltage 332A can be higher than the positive first clamping voltage 331A by a factor between about 0.25 and about 5, for example a factor of about 2. The high potential difference between the second clamping voltage 332A and grounded mask 20 is sufficient to chuck the mask 20 through the substrate 10 to the substrate carrier system 100.

In some embodiments, each electrode 311, 312 of each electrode set 305 may have two leads between the electrodes 311, 312 and the controller 160. Each lead may be held at the same voltage so that substantially no current flows through the electrodes 311, 312 in either chucking mode.

Referring to FIG. 3A and FIG. 3B, the controller 160 can be configured to selectively switch at least one electrode set, for example electrode set $305_6$, from the first group 301 as shown in FIG. 3A to the second group 302 as shown in FIG. 3B. The controller 160 can also be configured to selectively switch at least one electrode set, for example electrode set $305_3$, from the second group 302 as shown in FIG. 3A to the first group 301 as shown in FIG. 3B. The controller 160 selects which of the electrode sets 305 are included in the first group 301 and the second group 302 based on a predefined criteria, such as the position of an external component (e.g., the spray bar 60) in relation to electrode assembly 300, the location of electrode assembly 300 within the processing chamber 55, according to a timed sequence, or other criteria.

Figure 4A:
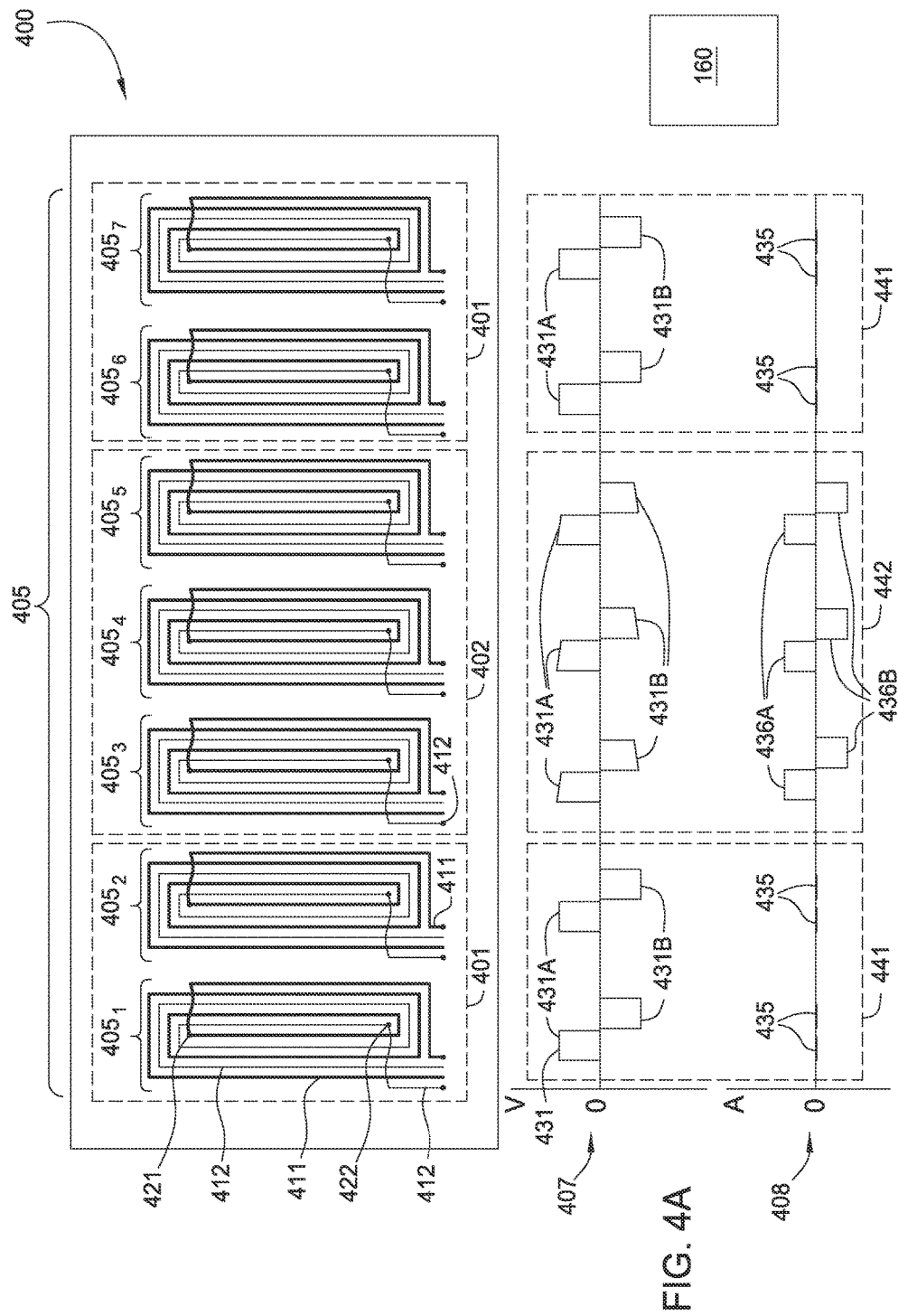
FIGS. 4A and 4B illustrate two operational states of an electrode assembly in accordance with another embodiment.
Figure 4B:
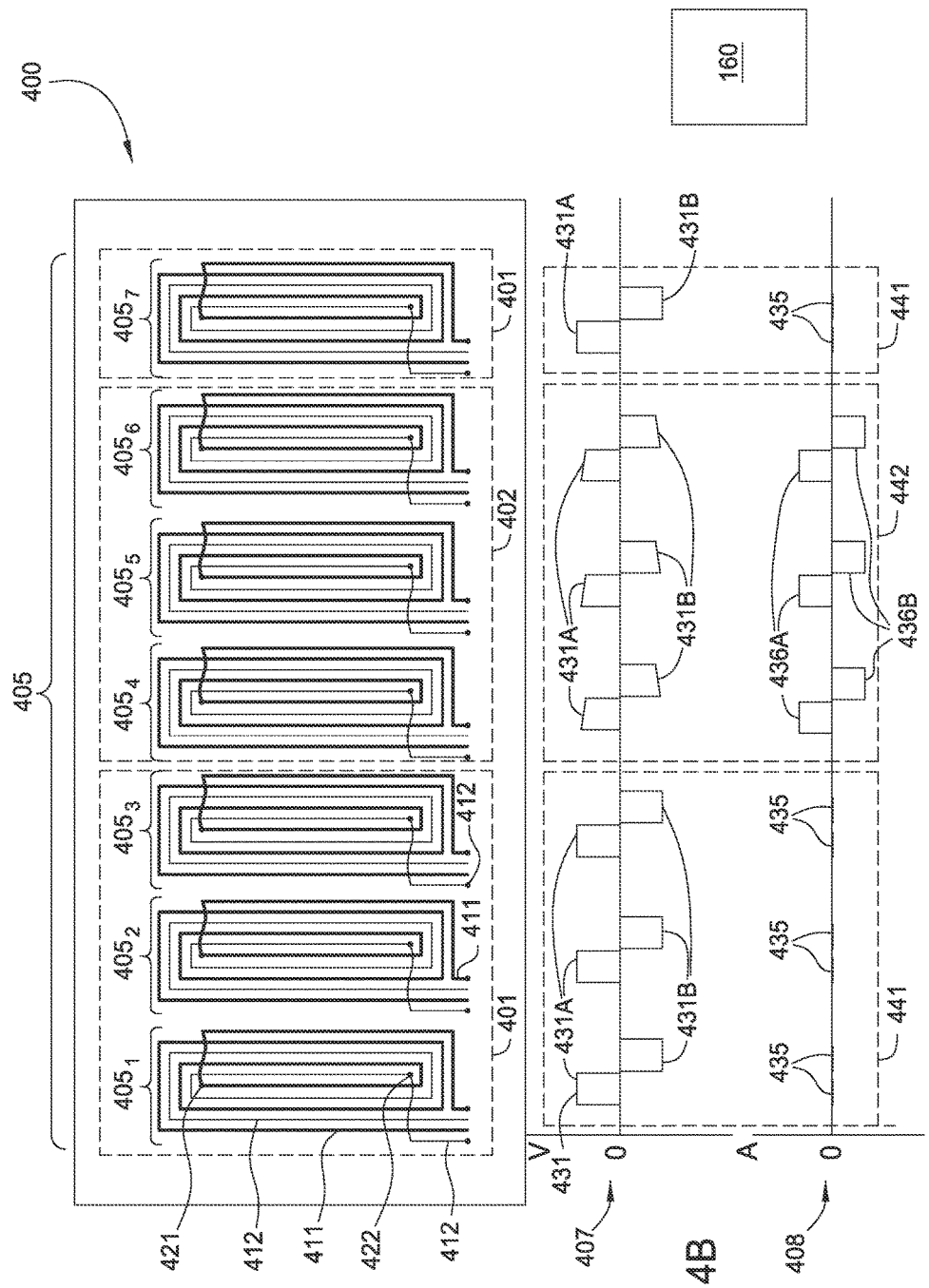

FIGS. 4A and 4B illustrate two operational states of an electrode assembly 400 in accordance with another embodiment. In the electrode assembly 400 is suitable for use with masks 20 that are electrically grounded or floating. The electrode assembly 400 may be used in as the electrode assembly 135 in the substrate carrier system 100, or other carrier system. The electrode assembly 400 is coupled to the controller 160, which controls operation of the electrode assembly 400, for example as described above with reference to FIGS. 2A-2D. The electrode assembly 400 includes a plurality of laterally spaced apart electrode sets 405, illustratively shown as electrode set $405_1$-$405_7$. Each individual electrode set $405_1$-$405_7$ includes a first electrode 411 interleaved with a second electrode 412. In one embodiment, each first electrode 411 includes a first coil 421, and each second electrode 412 includes a second coil 422. The first coil 421 is interleaved with the second coil 422. For the purposes of this disclosure, interleaved coils includes one coil disposed on top of a second coil, wherein one coil is not vertically superimposed over and aligned with the elements of the other coil.

Graphs 407, 408 below the electrode assembly 400 show voltages and currents applied to the first electrode 411 and the second electrode 412 for different electrode sets 405 of the electrode assembly 400 at different periods during processing of the substrate 10 retained by the electrode assembly 400. For example, the graph 407 shows a positive first clamping voltage 431A applied to the first electrode 411 of electrode sets $405_1$-$405_2$, $405_6$-$405_7$ and a negative first clamping voltage 431B applied to the second electrode 412 of electrode sets $405_1$-$405_2$, $405_6$-$405_7$. Alternatively, the positive first clamping voltage 431A can be provided to the second electrode 412 of electrode sets $405_1$-$405_2$, $405_6$-$405_7$ and the negative first clamping voltage 431B can be applied to the first electrode 411 of electrode sets $405_1$-$405_2$, $405_6$-$405_7$. The polarity of the first clamping voltages 431A, 431B provided to each electrode 411, 412 can be reversible during operation. The potential difference between the voltages applied to the electrode 411, 412 allows the electrode assembly 400 to function as a bi-polar electrostatic chuck to chuck the substrate 10 without chucking the mask 20. The graph 407 also shows the positive first clamping voltage 431A being applied to the first electrode 411 of electrode sets $405_3$-$405_5$, and the negative first clamping voltage 431B being applied to the second electrode 412 of electrode sets $405_3$-$405_5$. The slight slopes for the voltages 431A, 431B indicate a voltage drop across the leads of each electrodes 411, 412 as current flows through the electrodes 411, 412 of electrode sets $405_3$-$405_5$. The current flow through the electrodes 411, 412 of electrode sets $405_3$-$405_5$ creates an electromagnetic force that chucks the mask 20, being comprised of a magnetizable material, for example a metal containing material such as INVAR®, to the substrate carrier system 100 through the substrate 10.

The graph 408 shows substantially no current 435 being provided to or induced on the first electrode 411 or the second electrode 412 of electrode sets $405_1$-$405_2$, $405_6$-$405_7$. The graph 408 also shows a positive clamping current 436A being provided to the first electrode 411 of electrode sets $405_3$-$405_5$ and a negative clamping current 436B being provided to the second electrode 412 of electrode sets $405_3$-$405_5$. Alternatively, the positive clamping current 436A can be provided to the second electrode 412 of electrode sets $405_3$-$405_5$ and the negative clamping current 436B can be applied to the first electrode 411 of electrode sets $405_3$-$405_5$.

The controller 160 can be configured to select a first group 401 of the electrode sets 405 and a second group 402 of the electrode sets 405. The electrode sets 405 included in the first group 401 can be used to electrostatically clamp the substrate 10 to the substrate supporting surface 114. The electrode sets 405 included in the second group 402 can be used to electromagnetically clamp the mask 20 over the substrate 10 to the substrate supporting surface 114 as illustrated in FIG. 1C. Current flowing through the electrode sets 405 in the second group 402 creates a magnetic field which attracts and secures the mask 20 to the substrate carrier system 100. The controller 160 can be configured to operate the first group 401 of the electrode sets 405 in a first chucking mode by providing the first clamping voltages 431A, 431B to at least the first group 401 of the electrode sets 405. The electrodes 411, 412 when operated in the first chucking mode function as a bipolar electrostatic chuck. The first clamping voltages 431A, 431B can be DC voltages between about 500V and about 10,000V, for example about 3,000V.

The controller 160 can also be configured to operate the second group 402 of the electrode sets 405 in a second chucking mode by providing the positive clamping current 436A and the negative clamping current 436B to the second group 402 of the electrode sets 405. The electrode sets 405 when operated in the second chucking mode function as a bipolar electromagnetic chuck. The positive clamping current 436A and the negative clamping current 436B can be between about 10 mA and about 10 A, for example about 100 mA. In the embodiment shown in FIGS. 4A and 4B, the first clamping voltage 431 is applied to the electrode sets 405 in the first group 401 and the second group 402, making the voltages applied to the two groups 401, 402 equal or substantially equal. In some embodiments, a second clamping voltage (not shown) different from the first clamping voltage 431 can be applied to the electrode sets 405 in the second group 402.

Referring to FIGS. 4A-4B, the controller 160 can be configured to selectively switch at least one electrode set $405_6$ from the first group 401 as shown in FIG. 4A to the second group 402 as shown in FIG. 4B. The controller 160 can also be configured to selectively switch at least one electrode set $405_3$ from the second group 402 as shown in FIG. 4A to the first group 401 as shown in FIG. 4B. The controller 160 can switch the electrode sets 405 included in the first group 401 and the second group 402 based on a predefined criteria, such as the position of an external component (e.g., spray bar 60) in relation to electrode assembly 400, the location of electrode assembly 400 within the processing chamber 55, or according to a timed sequence.

Figure 5A:
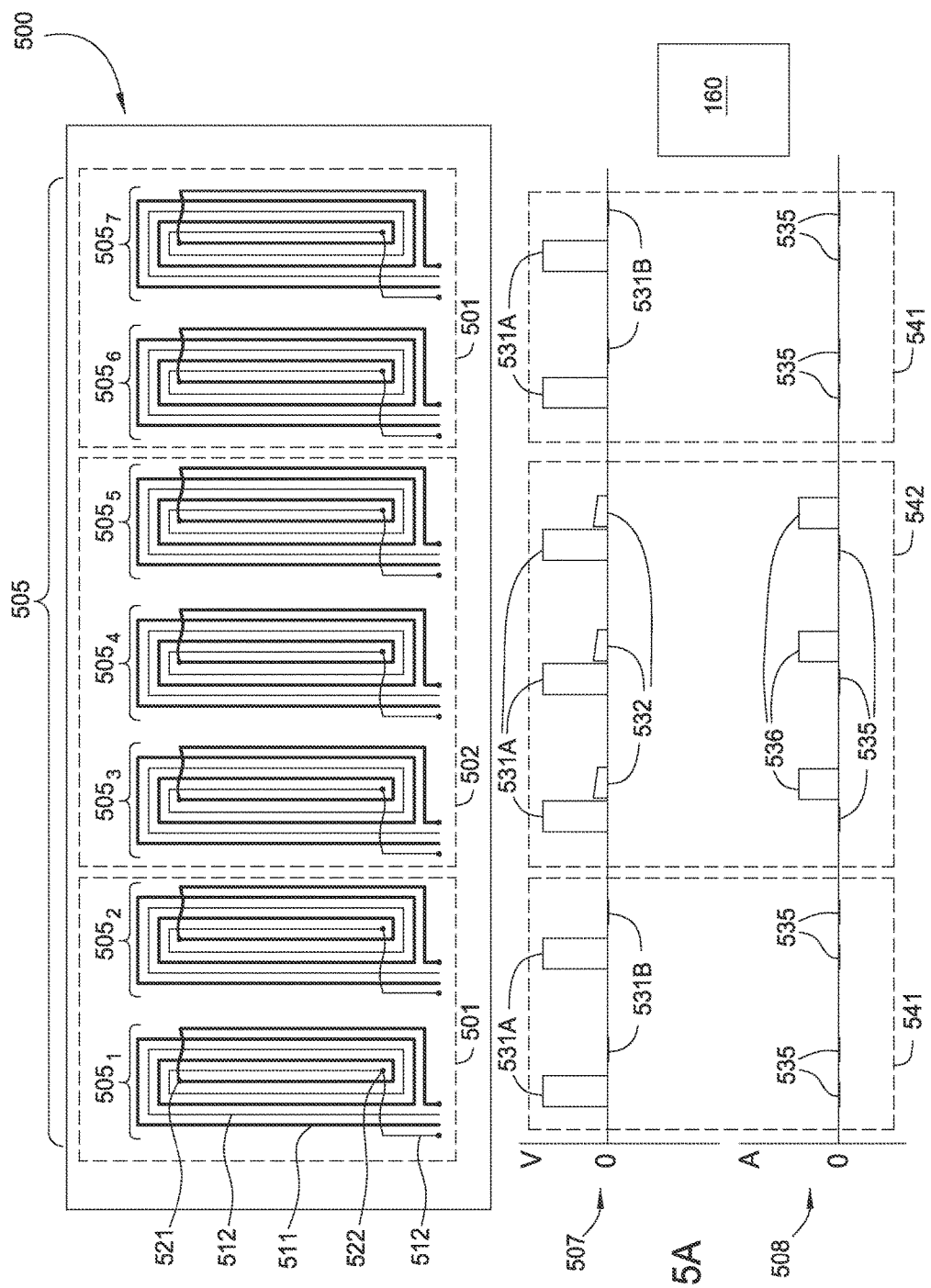
FIGS. 5A and 5B illustrate two operational states of an electrode assembly in accordance with another embodiment.
Figure 5B:
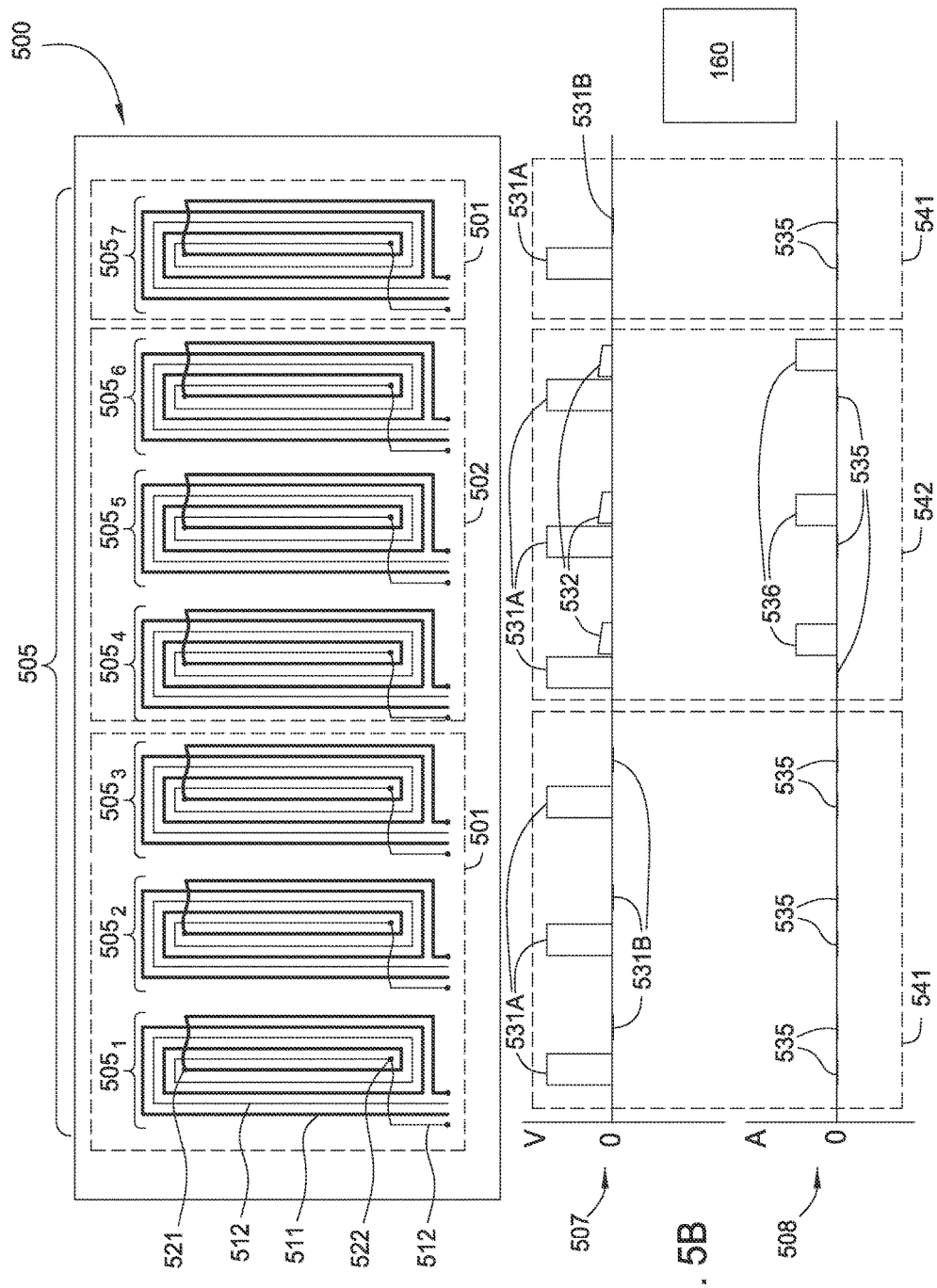

FIGS. 5A and 5B illustrate two operational states of an electrode assembly 500 in accordance with another embodiment. The electrode assembly 500 may be used as the electrode assembly 135 in the substrate carrier system 100, or other carrier system. The electrode assembly 500 is suitable for use with masks 20 comprised of a magnetizable material that are electrically ungrounded or electrically floating. The electrode assembly 500 is coupled to the controller 160, which controls operation of the electrode assembly 500, for example as described above with reference to FIGS. 2A-2D. The electrode assembly 500 includes a plurality of laterally spaced apart electrode sets 505, and each electrode set $505_1$-$505_7$ includes a first electrode 511 interleaved with a second electrode 512. In one embodiment, each first electrode 511 includes a first coil 521 while each second electrode 512 includes a second coil 522. The first coil 521 is interleaved with the second coil 522.

Graphs 507, 508 below the electrode assembly 500 show voltages and currents or induced applied to the first electrode 511 and the second electrode 512 for different electrode sets 505 according to the location of the electrode set 505 on the electrode assembly 500. For example, graph 507 shows a first clamping voltage 531A being applied to the first electrode 511 of electrode sets $505_1$-$505_2$, $505_6$-$505_7$ and substantially no voltage 531B being applied to the second electrode 512 of electrode sets $505_1$-$505_2$, $505_6$-$505_7$. Alternatively, the first clamping voltage 531A can be provided to the second electrode 512 of electrode sets $505_1$-$505_2$, $505_6$-$505_7$ and substantially no voltage 531B can be applied to the first electrode 511 of electrode sets $505_1$-$505_2$, $505_6$-$505_7$. The polarity of the first clamping voltage 531A provided to either electrode 511, 512 can be reversible during operation. The graph 507 also shows the first clamping voltage 531A being applied to the first electrode 511 of electrode set $505_3$-$505_5$, and a second clamping voltage 532 being applied to the second electrode 512 of electrode sets $505_3$-$505_5$. The slight slope for the second clamping voltage 532 indicates a voltage drop as current flows through the second electrode 512 of electrode sets $505_3$-$505_5$. The polarity of the second clamping voltage 532 provided to either electrode 511, 512 can also be reversible during operation. In some embodiments, the first clamping voltage 531A can be an opposite polarity to the second clamping voltage 532.

The graph 508 shows substantially no current 535 is provided to the first electrode 511 or second electrode 512 of electrode sets $505_1$-$505_2$, $505_6$-$505_7$. The graph 508 also shows a clamping current 536 being provided to the second electrode 512 of electrode sets $505_3$-$505_5$ and substantially no current 535 being provided to the first electrode 511 of electrode sets $505_3$-$505_5$. Alternatively, the clamping current 536 can be provided to the first electrode 511 of electrode sets $505_3$-$505_5$ and the substantially no current 535 can be applied to the second electrode 512 of electrode sets $505_3$-$505_5$.

The controller 160 can be configured to select a first group 501 of the electrode sets 505 and a second group 502 of the electrode sets 505. The electrode sets 505 included in the first group 501 can be used to electrostatically clamp the substrate 10 and the electrode sets 505 included in the second group 502 can be used to electromagnetically clamp the mask 20 over the substrate 10 to the substrate supporting surface 114 as illustrated in FIG. 1C. The mask 20, which can be used with an embodiment including electrode assembly 500, can be composed of a magnetizable material, such as a ferromagnetic compound. Current flowing through the electrode sets 505 in the second group 502 creates a magnetic field which attracts and secures the mask 20 to the substrate carrier system 100. The controller 160 can be configured to operate the first group 501 of the electrode sets 505 in a first chucking mode by providing the first clamping voltage 531A to at least the first group 501 of the electrode sets 505. The electrodes 511, 512 when operated in the first chucking mode function as a monopolar electrostatic chuck. The first clamping voltage 531A can be a DC voltage between about 500V and about 20,000V, for example about 6,000V.

The controller 160 can also be configured to operate the second group 502 of the electrode sets 505 in a second chucking mode by providing the clamping current 536 to the second group 502 of the electrode sets 505. The electrode sets 505 when operated in the second chucking mode function as a monopolar electromagnetic chuck.

The clamping current 536 can be between about 10 mA and about 10 A, for example about 100 mA. Since the clamping current 536 is generated at low voltages, the energy utilized to clamp the mask 20 is low compared to other chucking techniques. In some embodiments, a voltage different from the first clamping voltage 531A can be applied to the first electrode 511 of the electrode sets 505 in the second group 502 as opposed to the first group 501. The first clamping voltage 531A can be between about 5 to about 5,000 times higher than the second clamping voltage 532, for example about 10 times higher. In some embodiments, the second clamping voltage 532 can be a DC voltage less than about 100V, such as less than about 30V, for example about 10V.

Referring to FIGS. 5A and 5B, the controller 160 can be configured to selectively switch at least one electrode set 505, such as electrode set $505_6$, from the first group 501 as shown in FIG. 5A to the second group 502 as shown in FIG. 5B. The controller 160 can also be configured to selectively switch at least one electrode set 505, such as electrode set $505_3$, from the second group 502 as shown in FIG. 5A to the first group 501 as shown in FIG. 5B. The controller 160 can switch the electrode sets 505 included in the first group 501 and the second group 502 based on a predefined criteria, such as the position of an external component (e.g., spray bar 60) in relation to electrode assembly 500, the location of electrode assembly 500 within the processing chamber 55, or according to a timed sequence.

The substrate carrier system described herein enables the substrate to be electrostatically clamped to substrate carrier system while a mask is either electrostatically or electromagnetically clamped to the substrate carrier system, which improves product quality and manufacturing efficiency. Electrostatically or electromagnetically clamping the mask can spread an evenly distributed and lower clamping force over a target area of the substrate when compared to mechanical clamping systems that concentrate higher forces at the location of the mechanical clamps. This lower and evenly distributed clamping force can prevent contact contamination or physical damage to substrates often caused by the concentrated forces used by mechanical clamping. Additionally, clamping the mask only over the selected portions of the substrate which are being processed ensures the positional accuracy of the mask over the substrate is maintained while reducing the potential for undesirable particle generation. Furthermore, energy costs are reduced when compared to a system that clamps the entire mask because power is only supplied to the electrode sets selected to clamp portions of the mask when compared to supplying power to all of the electrode sets to clamp the entire mask.

While the foregoing is directed to typical embodiments, other and further embodiments may be devised without departing from the basic scope thereof, and the scope thereof is determined by the claims that follow.

What is claimed is:

1. A substrate carrier system comprising:
    a substrate carrier body having a substrate supporting surface; and
    an electrode assembly disposed in the substrate carrier body, the electrode assembly comprising a plurality of laterally spaced apart electrode sets, each electrode set comprising a first electrode interleaved with a second electrode;
    a support base supporting the substrate carrier body; and
    a controller configured to:
        select a first group of the electrode sets and a second group of the electrode sets from the plurality of the electrode sets;
        operate the first group of the electrode sets in a first chucking mode;
        simultaneously operate the second group of the electrode sets in a second chucking mode; and
        selectively switch at least one electrode set from the first group to the second group.

2. The substrate carrier system of claim 1, wherein the controller is configured to selectively switch at least one electrode set from the first group to the second group based on a location of the electrode set relative to a reference within a processing system.

3. The substrate carrier system of claim 1, wherein the electrode sets are laterally spaced apart in columns.

4. The substrate carrier system of claim 3, wherein the controller is further configured to sequentially switch electrode sets from the first group to the second group according to a sequence from a first end to a second end of the substrate carrier body.

5. The substrate carrier system of claim 4, wherein the sequence is synchronized according to a position of a spray bar relative to the substrate carrier body.

6. The substrate carrier system of claim 1, wherein the first electrode comprises a first set of fingers, the second electrode comprises a second set of fingers, and the first set of fingers are interleaved with the second set of fingers.

7. The substrate carrier system of claim 1, wherein the first electrode comprises a first coil, the second electrode comprises a second coil, and the first coil is interleaved with the second coil.

8. The substrate carrier system of claim 1, wherein the controller is configured to:
    operate the first group of the electrode sets in the first chucking mode as an electrostatic chuck; and
    operate the second group of the electrode sets in the second chucking mode as an electromagnetic chuck.

9. The substrate carrier system of claim 8, wherein the controller is further configured to operate the second group of the electrode sets in the second chucking mode as an electromagnetic chuck by providing a positive clamping current to each first electrode in the second group.

10. The substrate carrier system of claim 8, wherein the controller is further configured to operate the second group of the electrode sets in the second chucking mode as an electromagnetic chuck by providing a first clamping voltage to each first electrode in the second group and a clamping current at a second clamping voltage to each second electrode in the second group, wherein the first clamping voltage is more than ten times higher than the second clamping voltage.

11. A substrate carrier system configured for transporting through a processing system, the substrate carrier system comprising:
    a substrate carrier body having a substrate supporting surface,
    a support base supporting the substrate carrier body; and
    an electrode assembly disposed in the substrate carrier body, the electrode assembly having a plurality of electrode sets laterally spaced apart in columns, each electrode set comprising a first electrode interleaved with a second electrode;
    a power supply located on or in the support base and configured to supply a first clamping voltage and a second clamping voltage; and
    a controller located on or in the support base and configured to:
        select a first group of the electrode sets and a second group of the electrode sets from the plurality of electrode sets;
        operate the first group of the electrode sets in a first chucking mode;
        simultaneously operate the second group of the electrode sets in a second chucking mode; and
        sequentially switch electrode sets from the first group to the second group from a first end to a second end of the substrate carrier body.

12. A method of clamping a substrate and a mask to a substrate supporting surface of a substrate carrier body, the substrate carrier body having an electrode assembly disposed in the substrate carrier body, the electrode assembly comprising a plurality of laterally spaced apart electrode sets, each electrode set comprising a first electrode interleaved with a second electrode; the method comprising:
    selecting a first group of the electrode sets and a second group of the electrode sets from the plurality of the electrode sets;
    operating the first group of the electrode sets in a first chucking mode;
    simultaneously operating the second group of the electrode sets in a second chucking mode; and
    selectively switching at least one electrode set from the first group to the second group.

13. The method of claim 12, wherein switching further comprises sequentially switching electrode sets from the first group to the second group from a first end to a second end of the substrate carrier body.

14. The method of claim 12, wherein switching electrode sets from the first group to the second group is in response to a position of an external component relative to the substrate carrier body.

15. The method of claim 12, wherein operating in the first chucking mode electrostatically clamps the substrate to the substrate supporting surface and operating in the second chucking mode electromagnetically clamps the mask to the substrate.

16. The substrate carrier system of claim 1, wherein the controller is configured to operate the first group of the electrode sets in the first chucking mode as a bipolar electrostatic chuck.

17. The substrate carrier system of claim 16, wherein the controller is configured to operate the second group of the electrode sets in the second chucking mode as a monopolar electrostatic chuck.

18. The substrate carrier system of claim 9, wherein the controller is further configured to operate the second group of the electrode sets in the second chucking mode as the electromagnetic chuck by providing a negative clamping current to each second electrode in the second group.

19. The method of claim 12, wherein operating in the first chucking mode further comprises providing a positive first clamping voltage to each first electrode in the first group and a negative first clamping voltage to each second electrode in the first group; and wherein operating in the second chucking mode further comprises providing a second clamping voltage to each first electrode in the second group, and the second clamping voltage is higher than the positive first clamping voltage.

20. The method of claim 15, wherein operating in the second chucking mode further comprises:
providing a first clamping voltage to each first electrode in the second group; and
providing a clamping current at a second clamping voltage to each second electrode in the second group, wherein the first clamping voltage is more than about ten times higher than the second clamping voltage.

* * * * *